United States Patent [19]
Liedenbaum et al.

[11] Patent Number: 5,500,908
[45] Date of Patent: Mar. 19, 1996

[54] OPTICAL SWITCH AND TRANSMITTER AND RECEIVER FOR A MULTIPLEX TRANSMISSION SYSTEM INCLUDING SUCH A SWITCH

[75] Inventors: Coen T. H. F. Liedenbaum; John J. E. Reid, both of Eindhoven, Netherlands

[73] Assignee: U.S. Philips Corporation, New York, N.Y.

[21] Appl. No.: 397,591

[22] Filed: Mar. 2, 1995

[30] Foreign Application Priority Data

Apr. 14, 1994 [EP] European Pat. Off. .............. 94201018
Jun. 30, 1994 [EP] European Pat. Off. .............. 94201892

[51] Int. Cl.$^6$ .............................. G02F 1/295; G02B 6/26
[52] U.S. Cl. ................... 385/5; 385/16; 359/305; 356/73.1
[58] Field of Search ............................... 385/5, 8, 16, 24, 385/27, 39, 42, 48; 356/73.1, 351; 359/139, 141, 305; 250/227.18

[56] References Cited

U.S. PATENT DOCUMENTS

| | | | |
|---|---|---|---|
| 4,799,789 | 1/1989 | Tsukamoto et al. | 356/73.1 |
| 5,046,832 | 9/1991 | Bell | 359/305 |
| 5,104,219 | 4/1992 | Bell | 356/73.1 |
| 5,111,323 | 5/1992 | Tanaka et al. | 359/139 |
| 5,136,669 | 9/1992 | Gerdt | 385/39 |
| 5,148,129 | 9/1992 | Bolton | 385/29 |
| 5,297,224 | 3/1994 | Shaw | 385/16 |
| 5,309,455 | 5/1994 | Adachi et al. | 385/16 |
| 5,323,224 | 6/1994 | Barnard et al. | 385/16 |
| 5,343,286 | 8/1994 | Keeble et al. | 356/73.1 |
| 5,377,284 | 12/1994 | Bulow | 385/11 |

FOREIGN PATENT DOCUMENTS

0550929A1   7/1993   European Pat. Off. .

OTHER PUBLICATIONS

"Ultrafast all-optical switching utilizing the optical Kerr effect in polarization-maintaining single-mode fibres" by T. Morioka and M. Saruwatari in IEEE Journal on Selected Areas in Communication, vol. 6, No. 7, Aug. 1988.

"All-optical switching in non-linear X junctions" by J. P. Sabini et al. in Applied Physics Letters 55 (12), Sep. 1989, pp. 1176–1178.

"64 to 8 Gbit/s all-optical demultiplexing experiment with the clock recovery using new phase lock loop technique" by S. Kawanishi in Electronics Letters, Jan. 1993, vol. 29, No. 2, pp. 231–233.

"Pulse compression by an optical fibre loop mirror constructed from two different fibres" by A. L. Steele in Electronics Letters, vol. 29, No. 22, pp. 1972–1974 (no month).

(List continued on next page.)

*Primary Examiner*—Akm E. Ullah
*Attorney, Agent, or Firm*—Michael J. Balconi-Lamica

[57] ABSTRACT

The invention relates to an optical switch (1) which is switchable by means of light. The switch (1) comprises an optical wave-guiding structure (3) having an entrance (5) to which a signal can be applied and an exit (7). The refractive index of the wave-guiding structure (30) is variable by means of light intensity. The switch (1) further comprises a radiation source unit (15) whose radiation can be injected into the wave-guiding structure (3). The radiation source unit (15) comprises a pulsed laser (17) having a repetition time T and a pulse duration p and a medium (19) for transporting the radiation supplied by the laser (17). The radiation source unit (15) is provided with setting means (21) for stabilizing the wavelength of the laser (17) at a number n of selected wavelength bands from a number N of possibly selectable wavelength bands within one and the same pulse supplied by the laser (17). Moreover, the medium (19) is dispersive at a wavelength-dependent travel time $t_D$ in which the wavelength bands upon transport are separable in time as a result of dispersion.

17 Claims, 6 Drawing Sheets

OTHER PUBLICATIONS

"Optical Loop Mirror with Semiconductor Laser Amplifier" by M. Eiselt in Electronics Letters, Jul. 1992, vol. 28, No. 16.

"Non-linear Optical Loop Mirror" by N. J. Doran and D. Wood in Optics Letters, vol. 13, No. 1, Jan. 1988.

"64 GB/s all-optical demultiplexing with the non-linear optical loop mirror" by P. A. Andrekson et al. in IEEE Photonics Technology Letters, vol. 4, No. 6, Jun. 1992, pp. 644–647.

"Generation of transform limited optical pulses using all-optical gate" by R. A. Betts et al, in Electronics Letters, May 1992, vol. 28, No. 11, pp. 1035–1037.

OPTICAL SWITCH AND TRANSMITTER AND RECEIVER FOR A MULTIPLEX TRANSMISSION SYSTEM INCLUDING SUCH A SWITCH

BACKGROUND OF THE INVENTION

1. Field of the Invention

The invention relates to an optical switch which is switchable by means of light and comprises an optical wave-guiding structure whose refractive index is variable by means of light intensity, and at least an entrance to which a signal can be applied and at least an exit, said switch further comprising a radiation source unit whose radiation can be injected into the wave-guiding structure, the radiation source unit comprising at least a pulsed laser for supplying a pulse series having a repetition time T and a pulse duration p and a medium for transporting the radiation supplied by the laser.

The invention also relates to a transmitter and a receiver provided with such an optical switch and to a multiplex transmission system comprising such a transmitter and/or receiver.

2. Discussion of the Related Art

A switch of the type described in the opening paragraph is known, for example from the article "Non-linear Optical Loop Mirror" by N. J. Doran and D. Wood in Optics Letters, Vol. 13, No. 1, January 1988. The switch described in this article is implemented as a NOLM. The wave-guiding structure is a glass fibre ring which is obtained by interconnecting the two ends of a directional coupler, generally a 50:50 coupler, so that two gates functioning as an entrance and an exit are formed on the ring. When a signal is introduced into the ring via the entrance gate, this signal will be split into two equal signal portions by the directional coupler, which signal portions will traverse the ring in opposite directions and recombine in the coupler. Moreover, the ring accommodates a polarization-controlling element ensuring that the optical path lengths covered by the two signal portions remain equal. Destructive interference occurs at the exit gate and consequently no intensity will be measured at this gate. Using the optical non-linear property of a glass fibre, i.e. the refractive index is dependent on the optical intensity in this fibre in accordance with the relation $n = n_0 + n_2 I$, in which $n_2$ is the non-linear coefficient, an asymmetry may be caused in the ring due to injection of radiation which traverses the ring in one direction only. This radiation causes a phase change in the signal portion propagating in the same direction due to cross-phase modulation and will consequently produce a phase difference between the two signal portions propagating in opposite directions. The duration of the asymmetry caused and hence the duration of the resultant phase difference corresponds to the duration of the period in which extra radiation is injected. Due to this asymmetry, a different intensity distribution will temporarily occur at the two gates and the signal will be passed on to the exit gate. The absence or presence of a control pulse allows the ring to be switched between the mirror and the pass circuit.

A drawback of the known switch is that the rate at which the laser pulses succeed each other is limited by the repetition time of the laser. This repetition time is determined by the possibility of direct modulation of the diode laser and is of the order of 10 GHz. Moreover, the rate at which successive pulses are generated is limited by the presence of jitter which is produced during the build-up of a subsequent pulse, so that the pulse position is not sharply defined with respect to the pulse period.

SUMMARY OF THE INVENTION

It is an object of the invention to provide an optical switch whose switching rate is increased considerably. Moreover, the switching rate is not limited by the definition of the pulse position with respect to the pulse period of the laser used.

To this end, the optical switch according to the invention is characterized in that the radiation source unit is provided with setting means for stabilizing the wavelength of the laser at a number n of selected wavelength bands from a number N of possibly selectable wavelengths bands within one and the same pulse supplied by the laser, in that the medium is dispersive with a wavelength-dependent travel time $t_D$ in which the wavelength bands, upon transport, are separable in time as a result of dispersion.

A number N of possibly selectable wavelength bands is understood to mean the maximum number of selection wavelength bands which can be generated by means of the setting means.

A number n of selected wavelength bands is understood to mean the number of actually supplied wavelength bands by choosing those wavelength determining elements which are activated within the setting means.

If a number of wavelength bands from the spectrum of one and the same laser pulse is selected and subsequently passed through a dispersive medium, the wavelength bands will be separated in time as a result of the dispersion. In this way each pulse supplied by the laser is split into a number of sub-pulses corresponding to the number of selected wavelength bands. A radiation source unit whose repetition time is shorter as compared with the repetition time of the laser by a factor equal to the number of selected wavelength bands is thus obtained. Moreover, the pulse position of the pulses is more sharply defined because the pulses are now substantially free from jitter.

To prevent the first selected wavelength band of a subsequent pulse of the laser from overtaking the last wavelength band of the previous laser pulse, the optical switch according to the invention is characterized in that at least during a defined period the repetition time T of the laser is equal to or larger than the number n of selected wavelength bands multiplied by the minimum travel time difference $\Delta t_D$ between two wavelength bands, in which $\Delta t_D = |D| \cdot L_D \cdot \Delta\lambda$, in which $\Delta\lambda$ is the distance between two modi, $|D|$ is the dispersion and $L_D$ is the length of the dispersive medium.

The laser may be, for example a pulsed laser with a continuous spectrum. However, a preferred embodiment of the optical switch according to the invention is characterized in that the laser is a diode laser having a Fabry-Pérot spectrum.

A diode laser with discrete spectral components or Fabry-Pérot modi is preferably used. The dimensions of such a laser enhance the compactness of the switch. The distance between successive sub-pulses is defined by the longitudinal mode distance of the laser, which distance is in its turn defined by the length of the diode laser.

A further embodiment of the optical switch according to the invention is characterized in that the setting means are constituted by optical wavelength-selective feedback means arranged in the path of the laser radiation, which feedback means comprise at least a feedback element which is at least partially reflective for the number n of selected wavelength bands and is arranged at a distance d from the diode laser, which distance is defined by the condition $$d \leq \frac{c}{2} \cdot T$$

in which c is the light velocity in a medium traversed by the radiation beam and T is the repetition time.

A preferred embodiment of the optical switch according to the invention is characterized in that the distance d is defined by the condition $$d = \frac{c}{2} \cdot T - \frac{c}{2} \cdot \epsilon(p + \Delta p)$$

in which p is the pulse duration of the emitted laser pulse, T is the repetition time, c is the light velocity in a medium traversed by the radiation beam, $\Delta p$ is the build-up time of a pulse LP in the diode laser and $\epsilon$ is a real number satisfying $0 < \epsilon < 1$, which build-up time increases or decreases within these limits at a decreasing or increasing energy $E(P_r)$, respectively, of a radiation sub-pulse reflected by the feedback element, so that the condition $E(P_r) > E(LP_i)$ is satisfied at the instant when this radiation sub-pulse enters the diode laser, in which condition $E(LP_i)$ is the radiation energy built up in the diode laser at the relevant instant.

In this case, the adjustment of the laser wavelength is based on feedback.

At least a part of the radiation emitted by the laser is returned to the laser by the reflecting element. The reflection coefficient and the position of this element are chosen to be such that the radiation fed back by this element to the laser has such an intensity and reaches the laser at such a moment that this radiation will substantially completely determine the behaviour of the laser. In fact, it is generally known that lasers are sensitive to laser light which returns to the active medium of the laser via reflections in the radiation path of the laser beam. Dependent on the quantity of returning radiation, this may give rise to unwanted effects such as an increase of the line width, a higher noise or an offset of the laser wavelength and thus changes in the output spectrum. The behaviour of the laser is mainly determined by what happens in the time intervals in which a new optical pulse is built up. By causing a sufficiently large number of photons to arrive as a result of feedback in said time interval by adapting the energy of the reflected pulse and its travel time, these extra photons will mainly determine the behaviour of the laser. The laser can thus be controlled by the deliberate feedback which is to comply with given conditions.

For stabilizing the wavelength of the laser radiation when a diode laser is used, the radiation emerging at the rear mirror of the diode laser or the radiation emerging at the front mirror of the diode laser can be used.

Controlled optical feedback with the object of selecting a single wavelength from the Fabry-Pérot spectrum of a diode laser is described in European Patent Application EP 0 550 929 A1 in the name of the Applicant.

A first modification of the above-mentioned embodiment of the optical switch according to the invention is characterized in that the feedback means further comprise a first grating between the laser and the feedback element for spatially splitting the radiation beam supplied by the laser into a plurality of sub-beams each having a different wavelength band, and a second grating for rendering the sub-beams from the first grating parallel to each other.

The first grating spatially extends the beam into a number of sub-beams of different wavelengths having different directions due to dispersion. The second grating renders these sub-beams mutually parallel. In this way the spectral components of the beam will be disposed side by side. By causing this beam to be incident on an element arranged at the defined distance d of the laser and being at least partially reflecting for a number of these sub-beams or modi, the laser is forced to emit radiation at wavelengths which correspond to the wavelength of the reflected wavelength components.

A second modification of this embodiment is characterized in that the radiation path between the laser and the feedback means is split into at least a number of branches corresponding to the number n of wavelength bands to be selected, each branch comprising a wavelength-selective element.

The radiation from the laser can be distributed among different branches, while a wavelength-selective element for a different wavelength can be arranged in each branch. The radiation which returns to the laser via the different branches has a limited number of wavelength bands.

An embodiment of the optical switch according to the invention is characterized in that the wavelength-selective element is a grating.

A grating has a relatively high wavelength-separating power. The wavelength to be selected can be chosen by varying the orientation of the grating with respect to the radiation beam of the laser.

Another embodiment of the optical switch according to the invention is characterized in that the wavelength-selective element is an etalon.

The material between the plane-parallel plates of the etalon may be, for example air, a liquid crystal, a semiconductor or an electro-optical material. By variation of the optical thickness of the etalon, the free spectral range will change, i.e. the difference between two wavelengths both fitting within the width of the etalon. By giving the etalon in each branch a different optical thickness, it is thus possible to select a different wavelength for each branch.

Another embodiment of the optical switch according to the invention is characterized in that the feedback means comprise a number of feedback elements corresponding at least to the number n of wavelength bands to be selected, which feedback elements are implemented as DBR (Distributed Bragg Reflector) mirrors integrated in one and the same medium.

The pitch of the grating determines the wavelength reflected by the DBR mirror. Such DBR mirrors may each be arranged in a separate waveguide, which waveguides are, for example substantially parallel to each other and terminate in a single waveguide which provides a connection for the laser to be influenced. Such a feedback element can be manufactured in a relatively simple manner and, moreover, it is compact.

An alternative embodiment of the optical switch according to the invention is characterized in that the setting means are constituted by a number of radiation sources corresponding to the number N of possibly selectable wavelength bands, which radiation sources have their respective radiation stabilized at given wavelength bands which are different from each other and can be simultaneously injected into the laser.

The adjustment of the laser is based on optical injection in this case.

In this case each laser generates different wavelengths which are injected into the control pulse laser simultaneously and in the build-up time of a pulse. Consequently, the laser will generate radiation at wavelengths corresponding to the wavelengths of the injection lasers.

. A preferred embodiment of the optical switch according to the invention is characterized in that the switch is implemented as a NOLM, in which the optical wave-guiding structure is an optical fibre ring into which the radiation of the radiation source unit can be injected asymmetrically.

A NOLM is known per se from the afore-mentioned article "Non-linear Optical Loop Mirror" by N. J. Doran and D. Wood in Optics Letters, Vol. 13, No. 1, January 1988. By using the present invention, a NOLM having a considerably shorter switching time is obtained.

The control pulse can be coupled into the ring in different manners.

A first possibility is to use an extra coupler in the ring, preferably as close as possible to the directional coupler. The length L across which the asymmetry is caused in fact also determines the magnitude of the phase difference in accordance with $\Delta\phi \approx n_2.2\pi.I.L/\lambda$ which L is the length of the glass fibre, I is the optical intensity and $\lambda$ is the wavelength of the injected pulse.

A second possibility is to connect the control pulse diode laser to the switch outside the ring. In that case a wavelength-dependent coupler is used instead of a 50:50 coupler. This wavelength-dependent coupler is a coupler operating, for example as a 50:50 coupler at the signal-conveying wavelength and being substantially insensitive as a coupler or operating in another ratio as a coupler for the wavelength of the control pulse laser.

Since each control pulse causes an asymmetry, the switching time will be shorter by a factor which is equal to the number n of selected wavelength bands when the output of the radiation source unit described above is used as a control pulse signal for the NOLM.

The invention further relates to a multiplex transmission system comprising a transmitter and a receiver, with a transmission medium in between.

Optical telecommunication systems aim at an increasing data transmission rate. This rate is, however, limited by the current bandwidth of the electronic processing circuits, typically of the order of 10 GHz, and also by the possibility of direct modulation of the diode lasers as signal sources. The latter is limited by the relaxation oscillation. This limit is also of the order of 10 GHz.

Due to the above-mentioned restrictions it is desirable to transmit more signals through a single transmission channel in multiplex transmission systems. To this end the different signals to be transmitted must be combined to a single signal at the transmitter end in one way or another and, at the receiver end, decomposed again into a number of signals whose bandwidth level is within the limits of the current electronic processing circuits.

The present invention is based on the recognition that the transmission rate of data signals of a multiplex transmission system can be increased considerably by using an optical switch as described hereinbefore. Since this is achieved in an entirely optical manner, limitations imposed by electronic circuits and the use of expensive electronic components are also prevented.

The multiplex transmission system according to the invention is therefore characterized in that at least the transmitter or the receiver comprises at least an optical switch as described hereinbefore.

The relatively high transmission rate is enhanced by providing either the transmitter or the receiver, or both with at least such an optical switch.

Since the optical switch is faster than the repetition time between two successive pulses of a conventional diode laser, the data transmission rate is increased considerably.

One way of decomposing the signals at the receiver end is to provide the receiver with a light-controlled optical switch as is known, for example from the article "64 GB/s all-optical demultiplexing with the non-linear optical loop mirror" by P. A. Andrekson et. al. in IEEE Photonics Technology Letters, Vol. 4, No. 6, June 1992, pp. 644–647. In the known multiplex transmission system the optical switch is a NOLM (Non-linear Optical Loop Mirror). The data signal is entered into the ring at a first gate via, for example a 50:50 coupler and split into two sub-signals. Via a second coupler a control pulse is coupled into the ring which traverses the ring in the same direction as one of the sub-signals and subsequently produces a phase difference between the subsignals propagating in the opposite direction so that the intensity distributions at the two gates are different during the travel time of the control pulse. In this way sub-signals can be selected from a composite data signal, which sub-signals can be processed by means of the available electronic processing circuits.

A drawback in this case is that the rate at which the data bits can be passed on to the exit channel is dependent on the repetition time of the control pulse diode laser and on the definition of the pulse period of the diode laser.

If at least the receiver is provided with an optical switch according to the invention, the receiver is characterized in that it is provided with at least an optical switch, while the signal which can be applied to the entrance of each switch is a signal transported via the transmission medium and composed of a number of sub-signals via time-division multiplexing, from which composite signal each time a sub-signal can be selected by means of the radiation source unit.

In this case a data series is injected at the entrance of the switch, for example the first gate of the ring. By coupling the radiation of the control pulse diode laser into the ring, the switch is opened temporarily. By means of the setting means a choice can be made as to which wavelength bands possibly to be selected is activated and in this way it can be determined which sub-signal must be separated from the composite signal so as to be passed on, for example to a detection channel. If more than one signal is to be selected, a corresponding number of optical switches can be arranged in series. A signal is then injected at the entrance of the next switch, which signal consists of all sub-signals except the signals already coupled out by the previous switches. The composite signal can also be decomposed into sub-signals by arranging the optical switches in parallel instead of in series with each other.

The different signals to be transmitted at the transmitter end can be combined in different manners. One of the suitable techniques is known as time-division multiplex. A single-mode laser supplying pulses whose pulse duration is much shorter than the repetition time between two successive pulses is used as a signal source. By splitting into a number of channels having a different delay time, followed by combination of the channels, a pulse train having a shorter repetition time can then be generated. The different data signals to be transmitted are alternately applied to the different channels via intensity modulation. When combining a large number of different signals to a single composite signal, a relatively high bit rate signal is obtained. The different pulses of the composite signal need not originate from the same diode laser but may alternatively originate from different diode lasers, provided that precautions are taken as regards timing and wavelength.

A drawback is that the rate at which the different data bits succeed each other in a single transmission channel is limited by the repetition time of the control pulse laser.

To obviate this drawback, the transmitter according to the invention is characterized in that it is provided with an optical switch, which transmitter further comprises a continuously operated laser whose wavelength is stabilized at a defined wavelength band for supplying the signal which can be applied to the entrance of the switch, and in that the pulses of the radiation source unit are carriers for a data series to be transported.

Via the first gate, the radiation of a continuously operated single-mode diode laser is applied to the ring, which radiation is split into two sub-signals. Moreover, the radiation of a radiation source unit according to the invention is applied with controlled emission in one of the two directions. Consequently, a pulse train whose pulses have the wavelength of the continuously operated single-mode laser and which will succeed each other at a rate which corresponds to the rate at which the selected wavelength bands of Fabry-Pérot modi of the radiation source unit succeed each other will be produced at the exit, for example the second gate of the optical switch. In this way Fourier-limited optical pulses are obtained and all pulses of the pulse train thus formed and serving as a carrier for a given dam series which must be transmitted to the receiver have the same wavelength.

A transmitter in which Fourier-limited pulses are generated at a rate corresponding to the repetition time of the control pulse laser itself is known per se from the article: "Generation of trans/brm limited optical pulses using all-optical gate" by R. A. Belts et. al. in Electronics Letters, May 1992, Vol. 28, No. 11, pp. 1035–1037. The frequency of the pulses is limited by the limits imposed by the current electronic processing circuits (10 GHz). By using the present invention, Fourier-limited pulses are generated whose repetition time is increased by a factor which is equal to the number of selected modi. In this way frequencies can be achieved (for example 40 GHz in the case of four selected modi) which cannot be achieved with the current electronic processing circuits.

An alternative embodiment of the transmitter according to the invention is characterized in that the transmitter comprises at least an optical switch which is switchable by means of light and has an optical wave-guiding structure whose refractive index is variable by means of light intensity and which has at least an entrance to which a signal can be applied and at least an exit, and further comprises a radiation source unit whose radiation can be injected into the wave-guiding structure, the radiation source unit comprising at least a pulsed, first laser for supplying a pulse series having a repetition time T and a pulse duration p, said radiation source unit being provided with setting means for stabilizing the wavelength of the first laser at a number n of selected wavelength bands from a number N of possibly selectable wavelength bands within one and the same pulse supplied by the first laser, said transmitter further comprising a continuous laser whose wavelength is stabilized at a defined wavelength band for supplying the signal which can be applied to the entrance of the switch, and in that the pulses of the radiation source unit are carriers of a data series to be transmitted, each first laser being stabilized at a different wavelength $\lambda_i$ and the setting means comprising a plurality of second lasers which corresponds to the plurality of first lasers and whose radiation can be injected into the associated first laser at an instant for which it holds that $E(P_m) > E(LP_i)$, in which $E(P_m)$ is the energy at the relevant instant of the second laser for a wavelength different from $\lambda_1$ of the corresponding first laser and $E(LP_i)$ is the radiation energy built up in the first laser at the relevant instant, said radiation source unit further comprising a plurality of wavelength discriminators corresponding to the plurality of first lasers and having a wavelength adjusted to the first lasers for selecting said wavelength from the radiation emitted by the first laser after injection, and means for combining and transporting the data series to be transmitted to the switch.

By making use of a combination of parallel-arranged units as described, the transmission rate of the transmission system is considerably increased in an alternative manner.

A further embodiment of a transmitter according to the invention is characterized in that the first lasers are diode lasers having a Fabry-Pérot resonant cavity and being active at a wavelength $\lambda_1$ which is different for each laser, and in that the wavelength of the associated second lasers is adjusted to a mode which is different from $\lambda_i$ of the associated first laser and fits in the resonant cavity of said first laser.

By choosing diode lasers with a Fabry-Pérot resonant cavity for the first lasers and by adjusting the wavelength of the associated second laser to a mode which fits in this resonant cavity and is different from $\lambda_i$, the coupling will be optimal.

BRIEF DESCRIPTION OF THE PREFERRED EMBODIMENTS

These and other aspects of the invention will be apparent from and elucidated with reference to the embodiments described hereinafter.

In the drawings

FIGS. 3a to 3d show, in detail, a plurality of embodiments of the feedback means for use in the radiation source unit of FIG. 2a;

DETAILED DESCRIPTION OF THE PREFERRED EMBODIMENTS

The pulsed laser used in the radiation source unit according to the invention may be both a laser having a continuous spectrum and a diode laser having discrete spectral components, i.e. Fabry-Pérot modi. For the sake of simplicity, the invention will be further described with reference to a diode laser. In a laser having a continuous spectrum a wavelength bands instead of the discrete modi are selected similarly in accordance with the invention.

Figure 1:
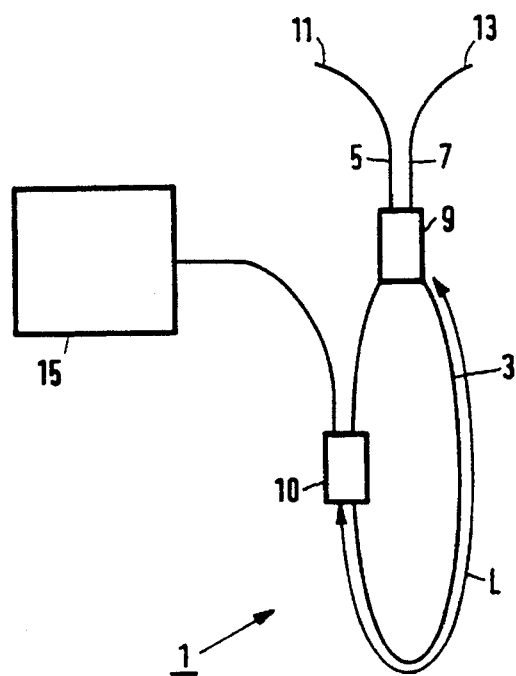
FIG. 1 shows diagrammatically an embodiment of the optical switch according to the invention.

The optical switch 1 shown diagrammatically in FIG. 1 comprises a wave-guiding structure 3 in the form of an annular optical fibre. The fibre may be made of, for example glass, but alternatively of a synthetic material. The two ends of a directional coupler 9, generally a 50:50 coupler, are interconnected so that two gates 11 and 13 are formed on the ring, which gates function as entrance and exit. If a signal is introduced into the ring 3 via the entrance gate 11, this signal will be split up by the directional coupler into two equal signal portions which will traverse the ring in opposite directions. Without any further measures the optical path length covered by the two sub-signals will remain the same. At the exit gate, for example the second gate 13, destructive interference will occur and no intensity will be measured. Using the optical non-linear property of a glass fibre, i.e. the refractive index is dependent on the optical intensity in this fibre in accordance with the relation $n= n_o + n_2 I$, in which $n_2$ is the non-linear coefficient, injection of extra radiation in the ring, traversing the ring in one direction only, may produce an asymmetry. To this end the switch 1 further comprises a pulsed radiation source unit 15 for supplying this radiation. In the switches hitherto known, the radiation source unit 15 is a pulsed diode laser. The radiation of this laser propagates together with only one of the two sub-signals in the ring and produces a phase change in the signal portion which propagates in the same direction due to crossphase modulation and consequently produces a phase difference between the two signal portions propagating in opposite directions. The duration of the produced asymmetry and hence the resultant phase difference corresponds to the pulse duration of a pulse of this diode laser. Due to the asymmetry generated during a control pulse period, the intensity distribution at the two gates will be temporarily different from that in the absence of a control pulse. The absence or presence of a control pulse thus enables the ring to switch between transmission element and reflector.

By replacing the control pulse laser by a radiation source unit comprising a control pulse laser and setting means for controlling the emission of the control pulse laser, a switch having a considerably shorter switching time is obtained.

The switch in a configuration as shown in FIG. 1 is shown as a NOLM.

Figure 2A:
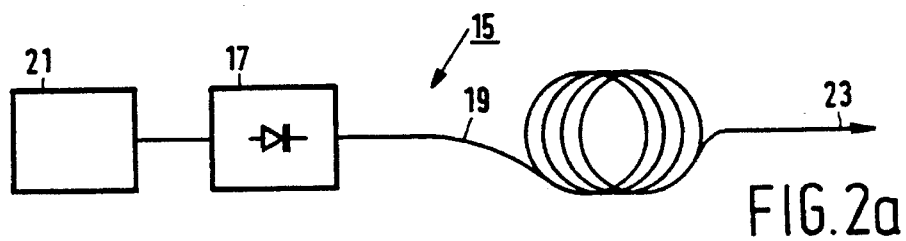
FIG. 2a shows diagrammatically, in detail, an embodiment of a radiation source unit for use in an optical switch according to the invention.
Figure 2B:
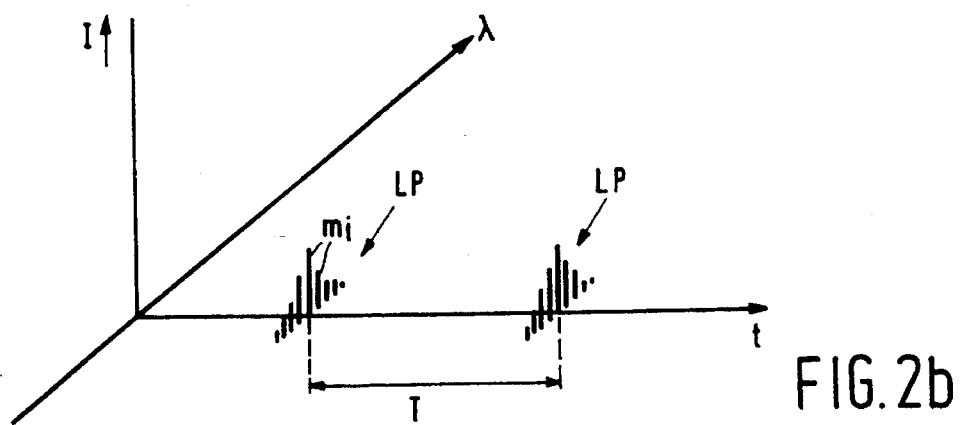
FIGS. 2b and 2c show a pulse series transmitted by a diode laser before and after feedback, respectively.

FIG. 2a shows in detail an embodiment of a suitable radiation source unit. The radiation source unit 15 comprises a diode laser 17 as a radiation source whose radiation is coupled into a dispersive medium 19. When a modulated current is applied, the diode laser 17 supplies a series of pulses LP having a pulse duration p and a repetition time T, each pulse consisting of a number of modi $m_t$ coinciding in time and jointly forming a Fabry-Pérot wavelength spectrum as is shown in FIG. 2b. The distance between these modi is determined by the length of the diode laser. For a diode laser which supplies radiation at a nominal wavelength of 1.3 μm and which is, for example 250 mm long, the mode distance is approximately 8 Å. The rate at which the pulses LP succeed each other is determined by the repetition time of the diode laser which is determined by the possibility of direct modulation of the diode laser which is, for example at approximately 10 GHz.

When such a pulse series is passed through a dispersive medium 19, the different Fabry-Pérot modi within the consecutive pulses LP are separated from each other in time.

Figure 2C:
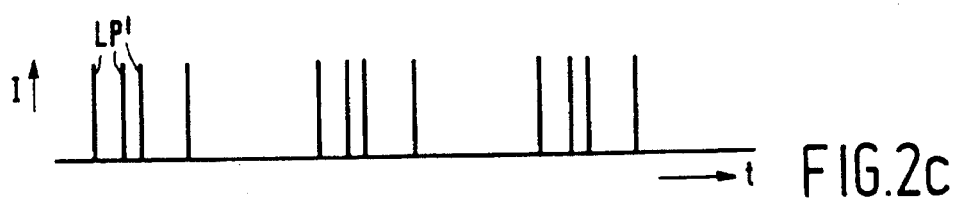

In the present invention a radiation source unit is proposed in which the rate at which the pulses succeed each other is increased by means of controlled emission of the diode laser 17. To this end the radiation source unit 15 is provided with setting means 21 for stabilizing the wavelength of the diode laser 17 at a number of selected Fabry-Pérot moden from a number of possibly selectable modi N within one and the same pulse LP of the diode laser 17. Each pulse LP supplied by the diode laser now comprises only a number of modi n, for example four, which are a few Å apart in wavelength and are activated by manipulation of the setting means. By causing the spectrum thus obtained to propagate through a dispersive medium, a dispersive glass fibre in the case of the drawing, the selected Fabry-Pérot modi are separated from each other in time, as is shown in FIG. 2c. Thus, a pulse train of pulses LP' whose repetition time is considerably shorter than that of the original pulse series is obtained at the end 23 of the glass fibre 19.

In order that the Fabry-Pérot modi are separated from each other in time by dispersion and the first pulse of the next diode laser pulse should not overtake the last pulse of the previous diode laser pulse, the repetition time of the diode laser 17 is to be equal to or larger than the number of possibly selectable modi N, multiplied by the minimum difference in travel time $\Delta t_D$. Here $\Delta t_D = |D| .L_D.L_D.\Delta\lambda$ in which $t_D$ is the wavelength-dependent travel time of the medium, D is the dispersion of the medium, $L_D$ is the length of the dispersive medium and $\Delta\lambda$ is the mode distance. A numerical example will be given by way of illustration. $\Delta t_D = 50$ ps ps applies when $\Delta\lambda = 6Å.D=16$ ps/nm.km and $L_D = 5$ km. The repetition time of the diode laser should be 200 ps at four modi, which corresponds to a modulation rate of 5 GHz, which is feasible without any problems when a conventional pulsed diode laser is used.

The control pulse may be coupled into the ring in different manners.

A first possibility, shown in FIG. 1, is to use an extra coupler 10 in the ring, preferably as close as possible to the directional coupler 9 because the length L across which the asymmetry is caused also determines the magnitude of the phase difference in accordance with $\Delta\phi \approx n_2.2\pi.I.L/\lambda$, in which L is the length of the glass fibre, I is the optical intensity and λ is the wavelength of the injected pulse.

In the Figures, in which the wave-guiding structure of the switch is shown as a glass fibre ring, the radiation of the radiation source unit 15 is always coupled into the glass fibre ring by means of an extra coupler 10.

However, a second possibility is to connect the radiation source unit 15 outside the ring. In that case a wavelength-dependent coupler instead of a 50:50 coupler is used. This wavelength-dependent coupler is a coupler which operates, for example as a 50:50 coupler at the signal-conveying wavelength and does not substantially operate as a coupler or at a different coupling ratio for the wavelength of the control pulse diode laser. In this way an asymmetry is also reduced between the two travel directions.

Figure 3A:
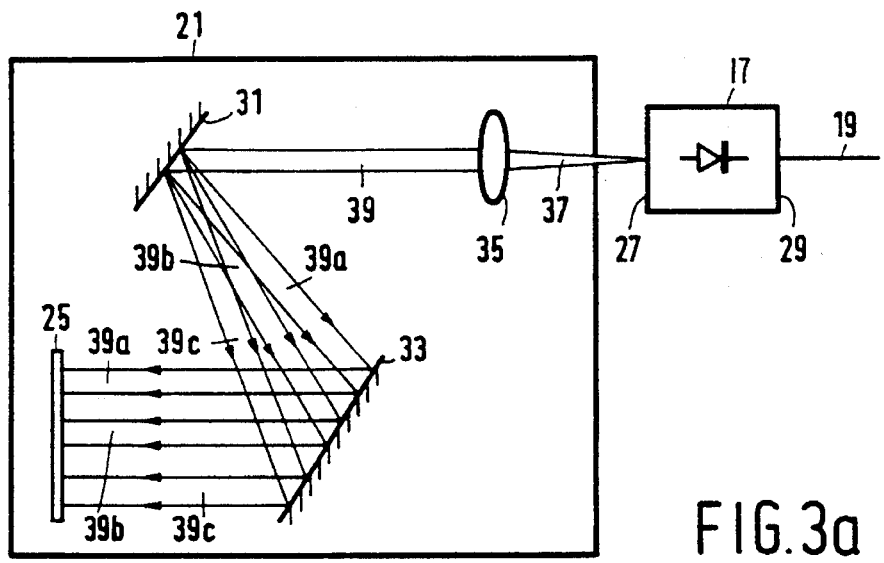

The setting means 21 may be implemented in different ways. A first embodiment is shown in FIG. 3a and comprises a feedback element 25 having a given reflection coefficient for the wavelength bands to be possibly selected or for the Fabry-Pérot modi in combination with two gratings 31 and 33. The laser beam 37 is sent as a parallel beam 39 towards the first grating via a lens system 35. As a result of dispersion, this grating 31 splits this beam 39 into a plurality of sub-beams 39a, 39b, 39c having different wavelengths of different directions. The spectral components be thus spatially separated from each other. The sub-beams 39a, 39b, 39c are rendered parallel again by the second grating 33. The different spectral components be now available as separate beams. Subsequently, the sub-beams are incident on the feedback element 25 which has discrete reflection areas. Such a feedback element 25 may be implemented, for example as a mask or an optical disc or an array of liquid crystals as described in the non-prepublished European Patent Application No. 94200336.9 (PHN 14.651). Since the feedback element 25 is only reflective or partially reflective for a limited number of wavelengths, the beam returning to the diode laser 17 will only comprise a selected number of sub-beams and hence a selected number of wavelengths at which the laser will be forced to emit at a given condition.

The condition at which forced laser action will occur implies that the feedback element 25 is to be positioned at a defined distance d with respect to the laser so as to ensure that the components reflected by the element 25 of the radiation pulse emitted by the diode laser 17 reach the diode laser 17 at a suitable intensity in the build-up time of a subsequent radiation pulse which is being generated. It is exactly within this build-up time that the process of stimulated emission occurring within the laser is maximally sensitive to photons supplied from the exterior so that the photons substantially completely determine the behaviour of the laser. If the laser is a diode laser, the feedback is preferably performed at the rear mirror 27 of the diode laser 17 for practical reasons, as is shown in the Figures, but the feedback may alternatively be realised at the front mirror 29 of the diode laser 17.

The distance d between the feedback element 25 and the diode laser mirror for realising the desired feedback is given by:

$$d = \frac{c}{2} \cdot T - \frac{c}{2} \cdot \epsilon(p + \Delta p)$$

Here, p is the pulse duration of the emitted laser pulse, T is the repetition time, c is the light velocity in a medium traversed by the radiation beam, $\Delta p$ is the build-up time of a pulse LP in the diode laser and f is the real number which satisfies $0 < \epsilon < 1$. The value of $\epsilon$ is determined by the energy of the reflected component. If this energy is relatively large, the reflected component may arrive at a later instant within the build-up time so that $\epsilon$ is then closer to zero than to one. If the energy of the reflected component is lower, the component is to arrive at the diode laser at an earlier instant within the build-up time so that e is closer to one than to zero. Consequently, $\epsilon$ is inversely proportional to the reflected pulse energy.

For a detailed description of the above-mentioned condition, reference is made to the afore-mentioned European Patent Application EP 0 550 929 A1.

Since the radiation source unit 15 supplies a pulse train having a repetition time which is considerably shorter than the repetition time which is feasible with the diode laser 17 itself, the rate at which the periods during which asymmetry is revised in the ring succeed each other will increase considerably so that the switching rate of the switch is increased by a hector which is equal to the number of selected Fabry-Pérot modi n.

A numerical example will be given by way of illustration. For a dispersive medium, for example a dispersive glass fibre 19 of, for example 10 km length in the radiation source unit 15, a peak power of approximately 150 mW of the diode laser 17 is necessary to switch the switch I from the first gate 11 to the second gate 13. The length of the glass fibre is determined by the distance along which a phase difference equal to $\pi$ is achieved between the signal portions travelling in opposite directions.

Figure 3B:
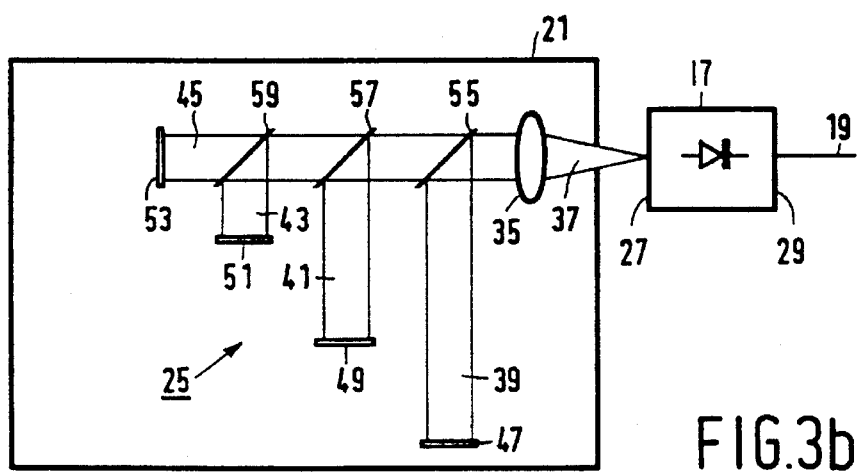

Another possibility of implementing the setting means 21 on the basis of optic wavelength-selective feedback is to split the radiation path between the laser and the feedback means into a number of branches, preferably in conformity with the number N of possibly selectable wavelength bands and at least in conformity with the number n of wavelength bands to be selected. FIG. 3b shows an embodiment. Each branch 39, 41, 43, 45 accommodates a wavelength-selective element 47, 49, 51, 53. The beam 37 coming from the laser 17 is passed to a number of partially transparent mirrors 55, 57, 59 via a lens system 35. The beam coming from the laser is thus split into sub-beams each being passed to a wavelength-selective element. A different wavelength is each time reflected on the wavelength-selective elements 47, 49, 51, 53 towards the partially transparent mirrors. The monochrome sub-beams are at least partly recombined and reflected towards the laser. In order that the laser is forced to work at the selected wavelengths, the distance d to the laser 17 for each of the elements 47, 49, 51, 53 is to satisfy the condition given hereinbefore.

The wavelength-selective elements 47, 49, 51, 53 may be, for example gratings. Gratings have a relatively high wavelength-separating power. By adapting the orientation of the grating to the beam incident thereon, the reflected wavelength can be chosen. The wavelength-selective elements may also be implemented as an etalon. An etalon comprises two plane-parallel plates between which a medium is present. This medium may be, for example a liquid crystal, an electro-optical medium, a semiconductor or air. By varying the optical thickness of the ion, the free spectra range is changed so that the distance between two successive wavelengths fitting within the width of the etalon changes. By choosing the optical thickness of the etalon to be different for each branch, a different wavelength is thus selected for each branch.

Figure 3C:
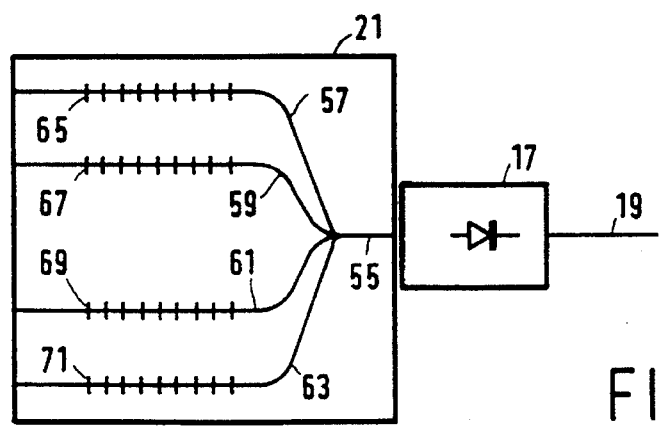

Another possibility of implementing the setting means 21 on the basis of optical wavelength-selective feedback is to integrate a number of DBR mirrors having different selection wavelengths in one and the same medium, for example semiconductor material such as, for example In FIG. 3c shows an embodiment of this possibility.

The radiation coming from the laser 17, preferably a diode laser in this case, is passed via a single waveguide 55 to a number of waveguides 57, 59, 61, 63 corresponding to the number of possibly selectable wavelengths. Each waveguide 57, 59, 61, 63 accommodates a known DBR (Distributed Bragg Reflector) 65, 67, 69, 71. The selection wavelengths reflected by the different waveguides 57, 59, 61, 63 are applied to the diode laser 17 via the single waveguide 55. This embodiment has the advantage that it can be implemented in an integrated form and is relatively easy to manufacture while it is stable and compact. Moreover, a single alignment of the element with respect to the diode laser 17 results in all DBR mirrors being well positioned with respect to the diode laser so as to obtain forced laser action.

The diode laser can be coupled by means of a coupling optical system or by means of a butt coupling as is shown in the Figure.

Figure 3D:
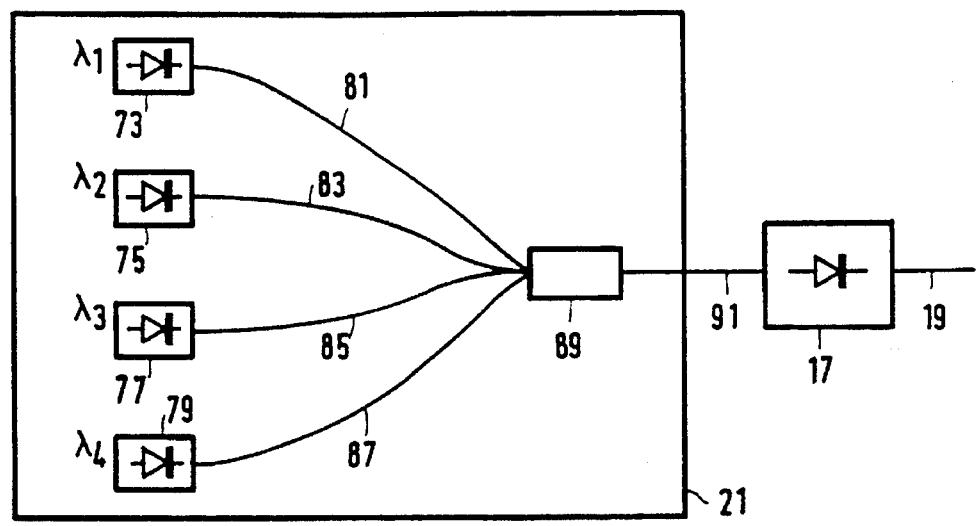

Another possible embodiment of the setting means 21 is based on injection and is shown in FIG. 3d. In this embodiment the radiation of a number n corresponding at least to the number of selected Fabry-Pérot modi or wavelength bands, but preferably a number N corresponding to the number of wavelength bands to be possibly selected, of lasers having a wavelength $\lambda_i$ are simultaneously injected into the pulsed laser 17 during the build-up time $\Delta p$ of the next pulse in this laser. In FIG. 3d all lasers are diode lasers. By providing each diode laser 73, 75, 77, 79 with an optical glass fibre 81, 83, 85, 87 which are then combined by means of a known glass fibre coupling 89, the radiation coming from the diode lasers is combined in a single glass fibre 91 which is coupled to the pulsed diode laser 17.

The diode lasers 73, 75, 77, 79 may be, for example DFB lasers which are integrated on one and the same substrate whose radiation is passed to the diode laser 17 via waveguides which are also integrated on the substrate, instead of via glass fibres and by means of, for example a butt coupling.

The optical switch 1 may not only be formed as a NOLM but also in other ways.

Figures 4A, 4B:
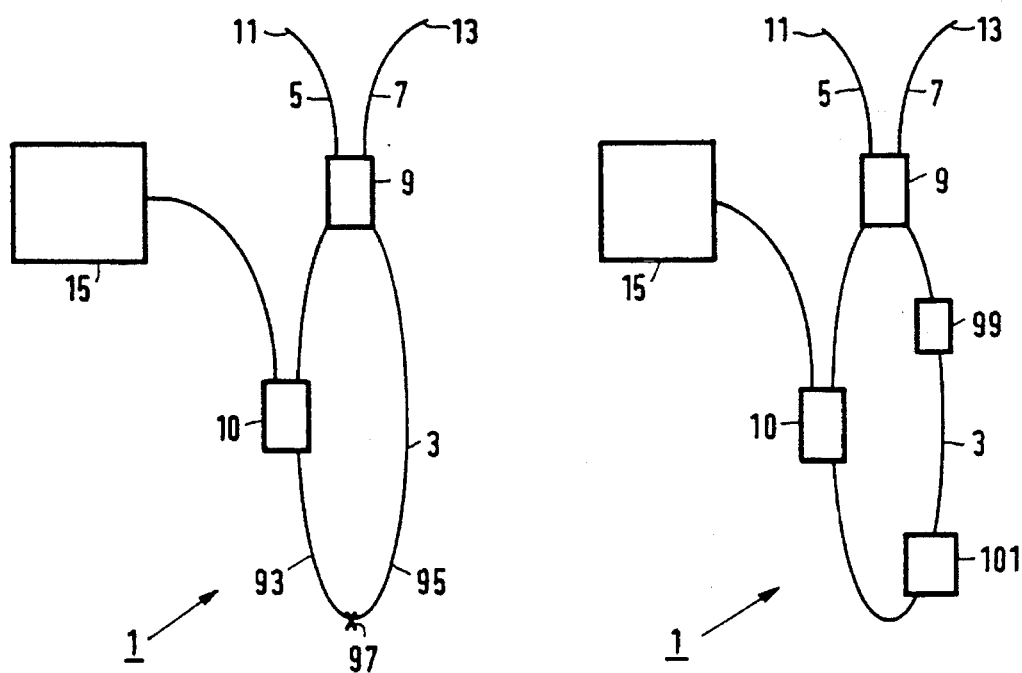
FIGS. 4a and 4b show two modifications of embodiments of the optical switch according to the invention.

An embodiment of a first modification of the NOLM is shown in FIG. 4a. Such a switch is known from the article: "Pulse compression by an optical fibre loop mirror constructed from two different fibres" by A. L. Steele in Electronics Letters, Vol. 29, No. 22, pp. 1972–1974. In the switch proposed in this article, which is a CFLM (Compound Fibre Loop Mirror) the difference with the NOLM is that the wave-guiding structure 3 being a glass fibre ring consists of two glass fibres 93, 95 having different optical properties, which fibres join each other and are connected to each other by means of, for example a seal 97. Since the sequence in which the two different glass fibres traversed by the two signal portions is different, there will be a difference in phase between the two signal portions propagating in opposite directions. Although the presence of two different glass fibres already gives the switch an asymmetry, it is nevertheless advantageous to use a control pulse diode laser in the form of a wavelength-controlled control pulse diode laser in the CFLM because this switch will thereby become controllable and faster.

A second modification of the NOLM is shown in FIG. 4b and represents a SLALOM (Semiconductor Laser Amplifier in Loop Mirror). The SLALOM is a known element and is described, for example in the article "Optical Loop Mirror with Semiconductor Laser Amplifier" by M. Elseli in Electronics Letters, July 1992, Vol. 28, No. 16. The CFLM and the NOLM or non-linear Sagnac interferometer are based on the optical non-linearity of the optical glass fibre, whereas the SLALOM is based on the optical non-linearity of the semiconductor laser amplifier. The SLALOM comprises a glass fibre ring 3 which, like the CFLM and the NOLM, is constituted by connecting two ends of a directional coupler 9, for example a 50:50 coupler. The ring further comprises a polarization-controlling element 99 and a semiconductor laser amplifier (SLA) 101.

It is to be noted that also a NOLM and a CFLM generally comprise a polarization-controlling element (not shown in the Figures) so as to ensure that the polarization of the propagating signal portions is maintained, thus realising an optimum interference.

When a data signal is injected into the ring via the first gate 11, it is split into two signal portions by the coupler 9, which signal portions will traverse the ring in opposite directions. Dependent on the relative phases of the two sub-waves, a pulse may appear either at the first gate 11 or at the second gate 13 due to interference between the two sub-waves in the coupler 9. The optical non-linearity which is responsible for the phase difference between the two sub-waves is introduced by the semiconductor laser amplifier 101 when a SLALOM is used. The amplifier 101 has such a position in the ring 3 that the propagation time of the two sub-waves between the coupler 9 and the amplifier 101 is different. In this way the two sub-waves reach the amplifier 101 at different instants. The sub-wave which reaches the amplifier 101 first saturates the amplifier, provided that its intensity is large enough to reach the point of saturation. The second sub-wave will then see a saturated amplifier and will be passed undisturbed, provided that the difference in time between the two pulses is smaller than the time needed by the amplifier to be desaturated. Although asymmetry is already produced in the ring by the semiconductor amplifier 101, a controllable and faster switch is obtained by connecting a control pulse diode laser with controlled emission according to the invention.

Another possible optical switch to which the present invention is applicable is described in the article "Ultrafast all-optical switching utilizing the optical Kerr effect in polarization-maintaining single-mode fibres" by T. Morioka and M. Saruwatari in IEEE Journal on Selected Areas in Communications, Vol. 6, No. 7, August 1988. In the switch described in this article the wave-guiding structure is formed by an optical glass fibre whose exit face is provided with a polarization rotation mirror. Such a mirror can be obtained by interconnecting the two exits of a polarization-sensitive beam splitter by means of an optical fibre as described in said publication. The two perpendicularly polarized components of the signal introduced into the switch will have a different refractive index upon propagation through the glass fibre due to birefringence of this glass fibre. Upon reflection on the polarization rotation mirror, the directions of polarization of the signal and of the control pulse laser having only one direction of polarization will be rotated through 90° and subsequently propagate along the opposite axes in the opposite direction. In this way the birefringence of the glass fibre is neutralized during the control pulse duration. By implementing this switch in accordance with the present invention, i.e. by replacing the control pulse laser by a radiation source unit 15, a switch having a considerably shorter switching time is obtained.

Yet another possibility of using the optical switch is described in the article "All-optical switching in non-linear X junctions" by J. P. Sabini et. al. in Applied Physics Letters 55 (12), September 1989, pp. 1176–1178. In this switch the wave-guiding structure is formed by an X junction. The X junction comprises four identical waveguides. Two of the waveguides have an entrance gate and the two other waveguides have an exit gate. By injecting the radiation from a control pulse laser at one of the two entrance gates, asymmetry will occur in the switch due to the nonlinearity, with the result that the intensity which is measured at the two exit gates will be different. By providing this switch with a radiation source unit 15 as a control pulse laser, a switch having a considerably shorter switching time is obtained again.

Optical switches as described above can be used to great advantage in transmitters and/or receivers of multiplex transmission systems in which a high transmission rate is required.

Figure 5:
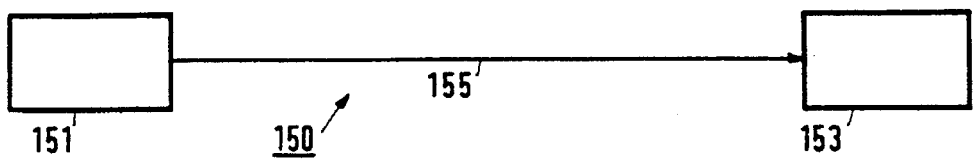
FIG. 5 shows diagrammatically an embodiment of a multiplex transmission system according to the invention.

FIG. 5 shows diagrammatically a multiplex transmission system 150. The transmission system 150 comprises a transmitter 151 and a receiver 153 between which a transmission medium 155 is present.

In the current transmission systems the transmission rate is limited, inter alia by the bandwidths of the electronic processing circuits. If the transmission rate is to be increased, more than one signal should be passed through a single channel. To this end different signals are to be combined in the same transmission channel at the transmitter end. At the receiver end, the composed signal is to be decomposed again into different signals having a bandwidth level which is feasible for the current electronic processing circuits.

Figure 6:
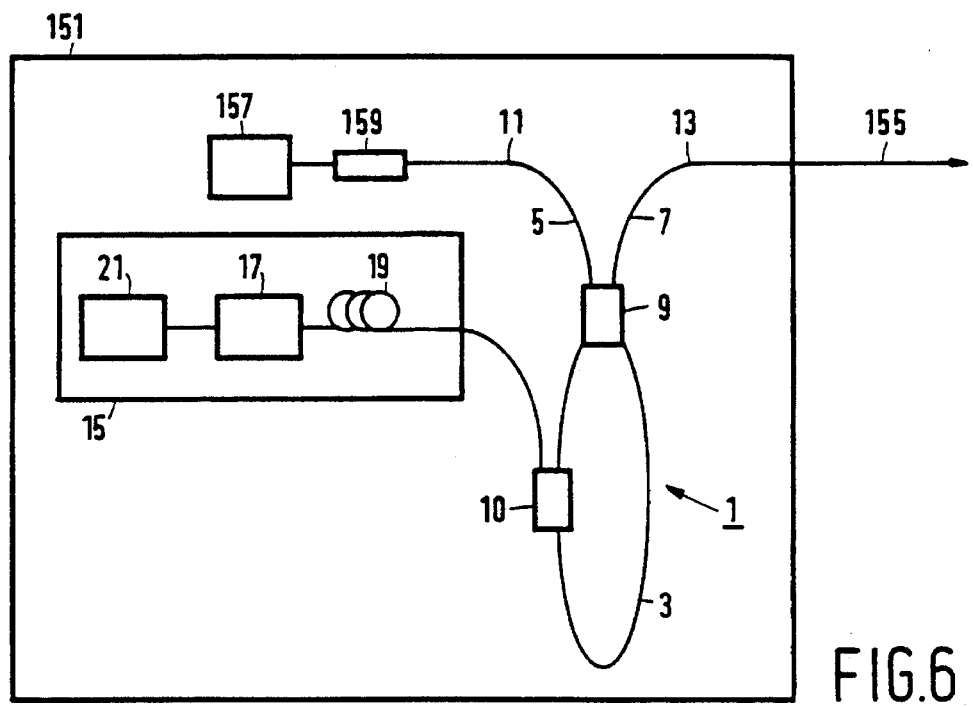
FIG. 6 shows diagrammatically an embodiment of a transmitter for use in a multiplex transmission system including an optical switch according to the invention.

The combination of different signals in one and the same channel at the transmitter end in a completely optical way can be realised by using an optical switch according to the invention in the transmitter. Such a transmitter 151 is shown in FIG. 6. The switch shown is implemented as a NOLM. The transmitter 151 comprises a singlemode diode laser 157 which is continuously operated, for example a CW DFB laser, followed by an isolator 159 for preventing radiation reflected in the system from returning to the laser. The radiation from this diode laser 157 is injected into the glass fibre ring 3 via the first gate 11 of the switch 1 and is split into two sub-waves at the 50:50 coupler 9, each sub-wave propagating through the fibre ring 3 in opposite directions. The data series to be transported via the transmission medium 155 of the transmission system 151 is distributed among the pulses of the pulse train of the radiation source unit 15 by setting means modulation corresponding to the data bits of the data series and is injected into the ring via the coupler 10. Whenever a pulse of the pulse train from the radiation source unit 15 travels in the ring 3, there will be a phase difference between the two sub-waves coming from the DFB laser and a signal can be measured during this period at the second gate 13, which signal has an intensity corresponding to the intensity of the CW DFB laser 157 and whose wavelength corresponds to the wavelength of the CW DFB laser 157. In this way a data train is produced at the second gate 13 of the switch 1, with all dam being carried by pulses having the same wavelength, which is required due to the dispersion occurring in the transmission medium 155.

Figure 8:
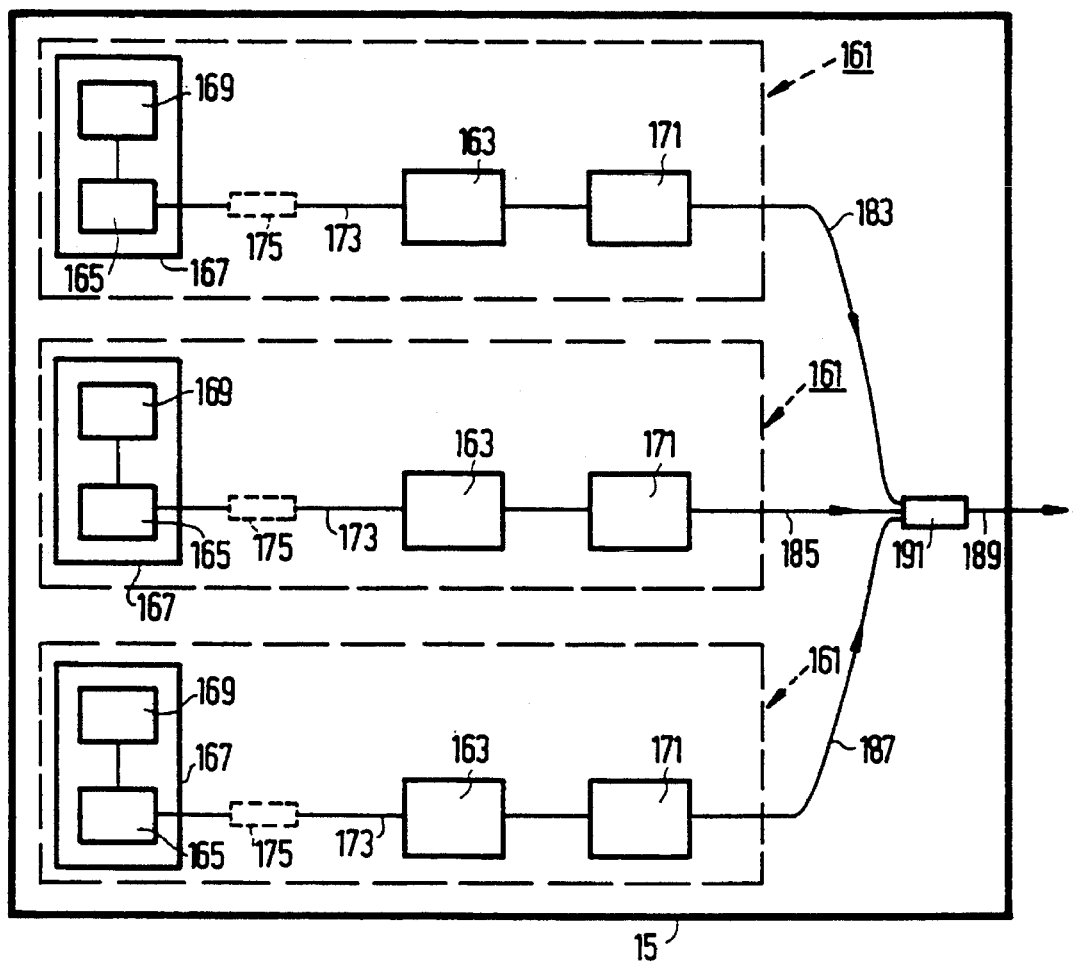
FIG. 8 shows diagrammatically an embodiment of a radiation source unit according to the invention, comprising a plurality of parallel-arranged units each generating a signal pulse series.

When the optical switch is used in a transmitter of a multiplex transmission system, the radiation source unit may be implemented in another manner. Referring now to FIG. 8 the alternative embodiment of the radiation source unit 15 comprises an assembly of parallel-arranged units 161 each supplying a signal pulse series at a different wavelength $\lambda_i$. The data transmission rate of the transmission system is thereby increased by a factor which is equal to the number of built-in units.

A unit 161 comprises a first, pulsed laser 163 having a pulse period T and a wavelength $\lambda_i$. To enable modulation of this pulse series with dam, a modulator can be used. However, a modulator for this purpose, which has a sufficiently high switching rate and with which a sufficiently high contrast can be realised between the digital "0" and the digital "1", is relatively difficult to manufacture and is expensive. For this reason, use is made of a second laser 165, also referred to as master laser, which forms part of a modulation unit 167. This laser 165 may be, for example a continuous DFB laser which is operated at a relatively high bias current by means of a current source 169. Via current modulation, this laser is provided with a data series so that the optical pattern of this laser will consist of a number of "0" and "1", while the optical power of the "0" level is unequal to zero. Instead of using current modulation, the laser 163 may alternatively be provided with data by means of injection by another pulsed laser which is connected to the laser via a fiber coupling. The modulation period of the second laser 165, i.e. the time between two successive data (0 or 1), is then adjusted to the pulse period T of the first laser 163. This laser supplies pulses having a very short pulse duration and is, for example a gain-switched laser. By injecting pulses of the pulse series of the second laser 165 into the first laser 163 in a time interval within which a pulse is built up in the first laser 163, the first laser 163 will be forced to generate a pulse at the wavelength of the injected pulse. This time interval is determined by the condition $E(P_m) > E(LP_i)$, in which $E(P_m)$ is the energy of a pulse of the second laser 165 injected into the laser 163 and $E(LP_i)$ is the radiation energy built up in the first laser 163 at the relevant instant. When the second laser thus emits a pulse at a given wavelength different from $\lambda_i$, i.e. a "1" in the digital signal, the first laser will emit a pulse at the same wavelength instead of at wavelength $\lambda_i$. When the second laser does not emit a pulse, i.e. a "0" in the digital signal, the first laser will generate a pulse of wavelength $\lambda_i$. In this way the first laser 163 thus supplies a pulse series having a pulse period T whose wavelength of successive pulses is determined by the pulse pattern of the second laser 165. When this pulse series is applied to a wavelength discriminator 171 passing only radiation of the wavelength of the first laser, $\lambda_1$, and absorbing the rest of the radiation, a modulated pulse pattern will be obtained which is complementary to the pulse pattern of the master laser 165 and all pulses of which have the same wavelength as the first laser, viz. $\lambda_1$. The signal pulse series thus produced may be converted to solirons in the transmission medium. In view of their time envelope and optical power, such pulses are eminently suitable for long-distance transmission.

Since the modulation of the first laser 163 is effected by radiation injection, the average charge carrier density in the laser 163 remains substantially consent and the optical pulses of the signal series will have substantially the same shape, so that the discrimination between the absence or presence of a signal, in other words the discrimination between pulses having a wavelength different from $\lambda_1$ and pulses having a wavelength equal to $\lambda_1$, is relatively large. This cannot be achieved by means of electrical modulation of the laser 163.

The discriminator 171 and the modulation unit 167 may be present at both sides of the slave laser 163, as is shown in FIG. 8. Users 163 and 165 may be coupled together via an optical fiber 173, as is shown in the Figure. The two lasers 163 and 165 may alternatively be coupled together via a butt coupling (not shown).

Figure 9:
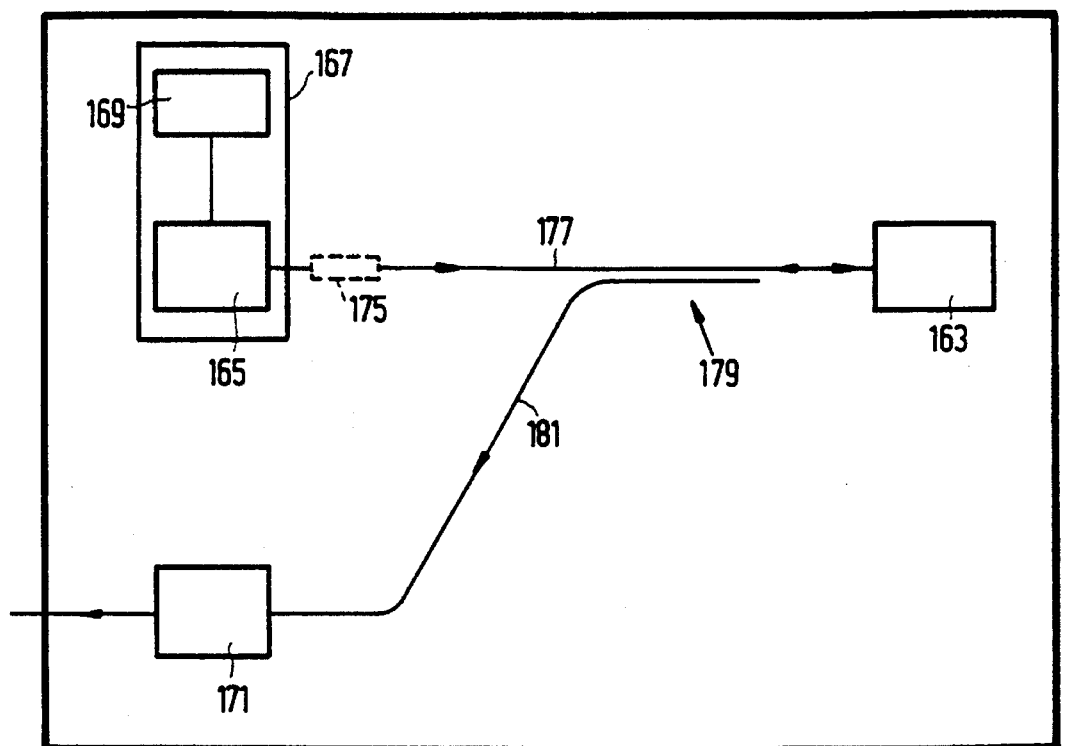
FIG. 9 shows diagrammatically an embodiment of an alternative configuration of a unit for generating signal pulses suitable for the radiation source unit shown in FIG. 8.

The discriminator 171 and the modulation unit 167 may alternatively be present at the same side of the slave laser 163. FIG. 9 shows an embodiment of a single unit in which this is the case. The radiation of the master laser 165 is passed to the slave laser 163 via a first optical fiber 177. The modulated radiation which returns from the slave laser 163 after injection of radiation of the master laser 165, is coupled into the second fiber 181 by means of a fiber coupler 179 of the first fiber 177 and subsequently passed towards the discriminator 171.

If desired, an optical isolator 175 may be arranged behind the master laser 165 so as to prevent radiation reflected in the unit 161 from returning to the laser 165. Since the isolator is facultative, it is shown by means of a broken line in the Figures.

By integrating the two lasers 163, 165 and the discriminator 171 on one and the same substrate, the unit may be made compact, robust and stable.

The wavelength of the radiation of the master laser 165 is such that its coupling into the slave laser 163 prevails over the internal coupling of this slave laser, so that the slave laser is forced to operate at a wavelength other than its own wavelength. However, coupling of the radiation of the master laser 165 into the slave laser 163 is optimal if the slave laser 163 is a laser having a Fabry-Pérot resonant cavity in which the wavelength of the master laser 165 corresponds to the wavelength of a non-active mode fitting in the resonant cavity.

The efficiency at which the modulation is transferred can be optimized by ensuring that the polarization of the radiation incident in the slave laser 163, i.e. the radiation coming from the master laser 165, is not exactly perpendicular to the polarization of the radiation generated by the slave laser itself. This can be realised by means of a polarization-rotating element, such as, for example a λ/4 plate.

To apply the different signal pulse series jointly to a receiver, the different signal pulse series, for example three as shown in FIG. 8, are combined via three optical fibers 183, 185, 187 in a single fiber 189 via a fiber coupling 191.

However, before being transported through the transmission medium, the signal pulse series originating from the different units are to be transferred to the same wavelength, because otherwise different wavelengths would arrive at different instants due to dispersion occurring during transport through the transmission medium.

Figure 10:
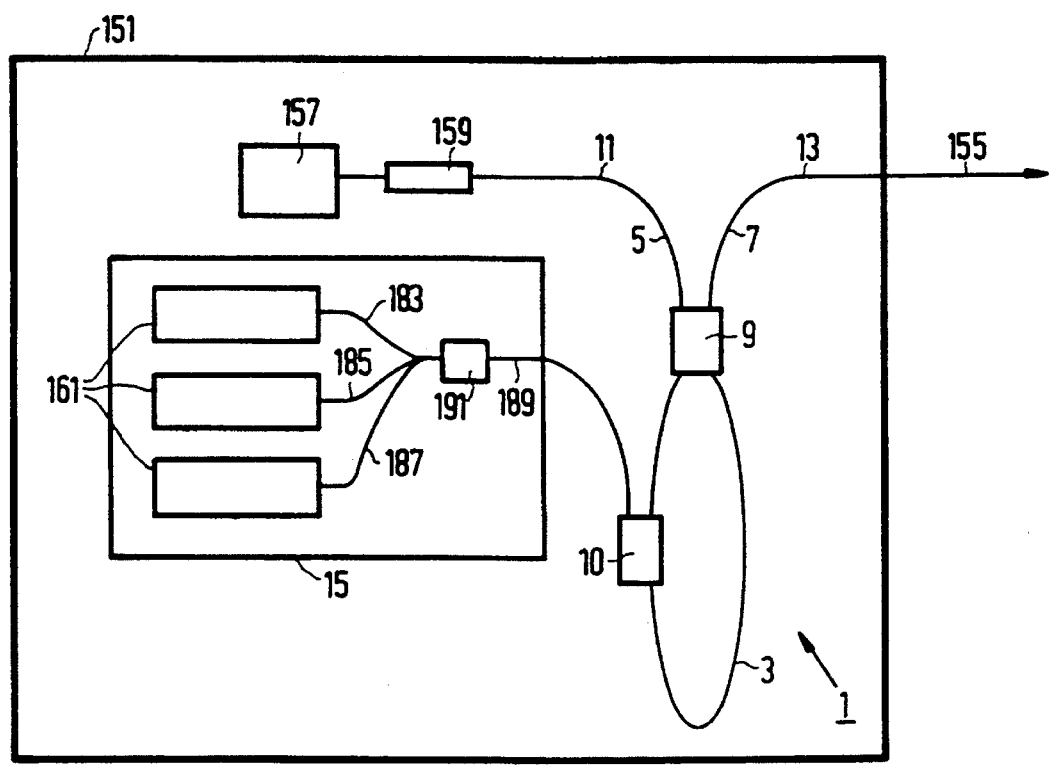
FIG. 10 shows diagrammatically a second embodiment of a transmitter according to the invention.

FIG. 10 shows an embodiment of a configuration with which the signal pulse series of the different units 161 are given the same wavelength. The optical switch is, for example again a NOLM. Analogously to FIG. 6, the transmitter 151 comprises a single mode laser 157 which is driven continuously, for example a CW DFB laser, which is followed by an optical isolator 159. The radiation from the laser 157 is injected into the optical fiber ring 3 via the first gate 11 of the switch 1 and split into two sub-waves at the coupler 9, each subwave propagating through the fiber ring in opposite directions. Whenever a pulse of one of the signal pulse series of a unit 161 travels along with the radiation of the diode laser 157 in the ring 3, there will be a phase difference between the two sub-waves which originate from the diode laser 157 and a signal whose wavelength and intensity correspond to that of the diode laser 157 will be measured at the second gate 13 during this period. In this way, a composite signal pulse series, all pulses of which have the same wavelength, is produced at the second gate 13.

A condition then is that the signal pulse series to be combined are synchronized with respect to each other in such a way that the series fit into each other at the instill of coupling the optical switch 1 into the coupler 10 without pulses overlapping. These methods are known per se.

Figure 7:
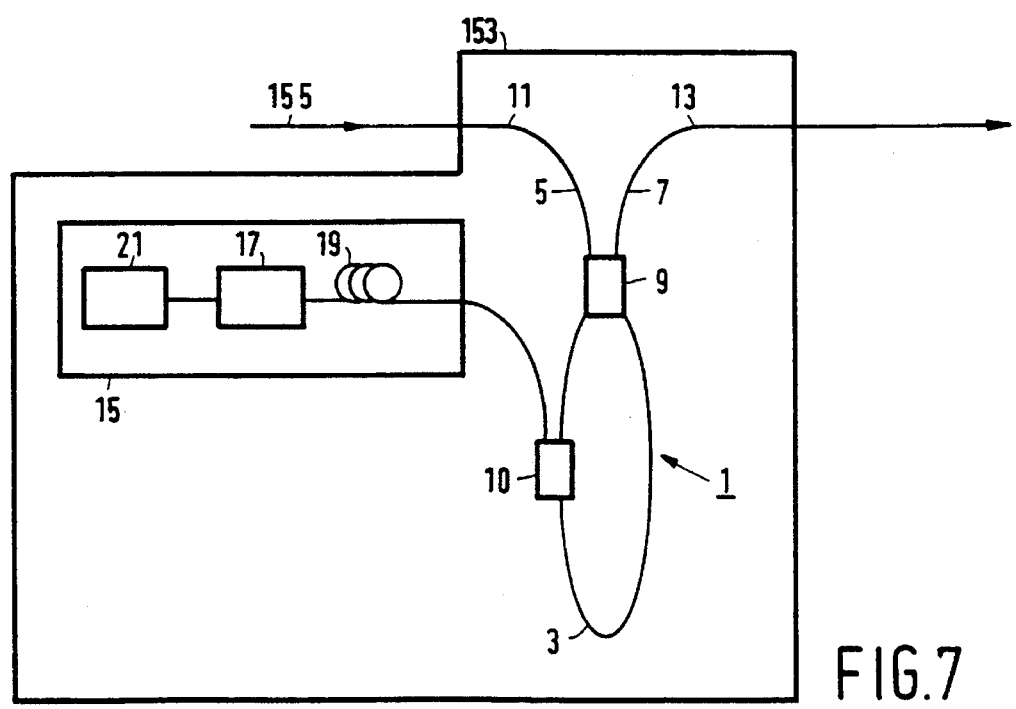
FIG. 7 shows diagrammatically an embodiment of a receiver for use in a multiplex transmission system including an optical switch according to the invention.

When different signals are combined to a signal which can be transported through a single channel, this composite signal should be decomposed again at the receiver end. This can be realised by providing the receiver with an optical switch according to the invention. Such a receiver 153 is shown in FIG. 7. The data signal coming from the transmitter 151 and transported via the transmission medium 155 is injected into the optical switch 1 via, for example the first gate 11. Radiation which is stabilized at a number of selected Fabry-Pérot modi or wavelength bands is injected as a control pulse series into the ring 3 via a coupler 10. By fixing the Fabry-Pérot modi or wavelength bands within the pulse emitted by the diode laser 17 at which the diode laser is to operate, i.e. by choosing a number n of wavelengths from the number N of possibly selectable wavelengths by manipulation of the setting means, it is thus possible to retrieve a given signal from the composite signal and to apply it, for example to a detector. The choice of these modi is determined by activating or not activating modi selected by means of the setting means. The signals present in the composite signal can be related to the control pulses by way of synchronization. For a possible way of realising this, reference is made to the article "64 to 8 Gbit/s all-optical demultiplexing experiment with the clock recovery using new phase lock loop technique" by S. Kawanishi in Electronics Letters, January 1993, Vol. 29, No. 2, pp. 231–233.

If more signals are to be detected from the composite signal, a number of the optical switches described can be arranged in series. A signal is then injected at the entrance of the next switch, which signal consists of all sub-signals except the signals already coupled out by the previous switches. In this way it is possible to choose at the receiver end which data bits are to be passed on to which channel for the purpose of detection. It is also possible to arrange different optical switches in parallel instead of in series so as to decompose the composite signal.

We claim:

1. An optical switch which is switchable via light comprising:

an optical wave-guiding structure whose refractive index is variable via light intensity, and having at least one entrance gate to which a light signal can be applied and at least one exit gate; and a radiation source unit whose radiation can be injected into the wave-guiding structure, the radiation source unit comprising at least one pulsed laser for supplying a pulse series having a repetition time T and a pulse duration p and a medium for transporting the radiation supplied by the laser for injection into the wave-guiding structure, characterized in that the radiation source unit is further provided with a setting means for stabilizing a wavelength of the laser at a number n of selected wavelength bands from a number N of possibly selectable wavelength bands within one and the same pulse supplied by the laser, further in that the medium is dispersive with a wavelength-dependent travel time $t_D$ in which the selected wavelength bands, upon transport, are separable in time as a result of a dispersion.

2. An optical switch as claimed in claim 1, wherein, at least during a deammed period the repetition time T of the laser is equal to or larger than the number n of selected wavelength bands multiplied by a minimal travel time difference $\Delta t_D$ between two wavelength bands, in which $\Delta t_D = |D| \times L_D \times \Delta \lambda$, in which $\Delta \lambda$ is the distance between two modi, $|D|$ is the dispersion and $L_D$ is the length of the dispersive medium.

3. An optical switch as claimed in claim 1 wherein the laser is a diode laser having a Fabry-Pérot spectrum.

4. An optical switch as claimed in claim 1 wherein the setting means comprises an optical wavelength-selective feedback means arranged in a path of the laser radiation, said feedback means comprises at least a feedback element which is at least partially reflective for the number n of selected wavelength bands and is arranged at a distance d from the laser, which distance is defined by a condition $$d \leq \frac{c}{2} \cdot T$$

in which c is the light velocity in a medium traversed by the laser radiation and T is the repetition time.

5. An optical switch as claimed in claim 4, wherein the distance d is defined by a condition $$d = \frac{c}{2} \cdot T - \frac{c}{2} \cdot \epsilon(p + \Delta p)$$

in which p is the pulse duration of an emitted laser pulse, T is the repetition time, c is the light velocity in a medium traversed by the laser radiation, $\Delta p$ is a build-up time of a pulse LP in the laser and $\epsilon$ is a real number satisfying $0 < \epsilon < 1$, wherein the build-up time increases or decreases within these limit at a decreasing or increasing energy $E(P_r)$, respectively, of a radiation sub-pulse reflected by the feedback element, so that a condition $$E(P_r) > E(LP_i)$$

is satisfied at the instant when the radiation sub-pulse enters the laser, in which condition $E(LP_i)$ is the radiation energy built up in the laser at a relevant instant.

6. An optical switch as claimed in claim 4 wherein the feedback means further comprises a first grating positioned between the laser and the feedback element for spatially splitting a radiation beam supplied by the laser into a plurality of sub-beams each having a different wavelength band, and a second grating for rendering the plurality of sub-beams from the first grating parallel to each other.

7. An optical switch as claimed in claim 4 wherein the radiation path between the laser and the feedback means is split into at least a number of branches corresponding to the number n of wavelength bands to be selected, each branch further comprising a wavelengthselective element.

8. An optical switch as claimed in claim 7, wherein the wavelength-selective element is a grating.

9. An optical switch as claimed in claim 7, wherein the wavelength-selective element is an etalon.

10. An optical switch as claimed in claim 4 wherein the feedback means further comprises a number of feedback elements corresponding at least to the number n of wavelength bands to be selected, wherein the feedback elements comprise DBR (Distributed Bragg Reflector) mirrors integrated in one and the same medium.

11. An optical switch as claimed in claim 1 wherein the setting means comprises a number of radiation sources for emitting radiation corresponding to the number N of possibly selectable wavelength bands, wherein the radiation sources have their respective radiation stabilized at given wavelength bands which are different from each other and can be simultaneously injected into the laser.

12. An optical switch as claimed in claim 1, wherein the optical switch is implemented as a NOLM (Non-linear Optical Loop Mirror), further wherein the optical wave-guiding structure is an optical fibre ring into which the radiation of the radiation source unit can be injected asymmetrically.

13. A multiplex transmission system comprising a transmitter and a receiver with a transmission medium in between, the multiplex transmission system further comprising at least one optical switch being switchable via light, wherein the at least one optical switch comprises:

an optical wave-guiding structure whose refractive index is variable via light intensity, and having at least one entrance gate to which a light signal can be applied and at least one exit gate; and a radiation source unit whose radiation can be injected into the wave-guiding structure, the radiation source unit comprising at least one pulsed laser for supplying a pulse series having a repetition time T and a pulse duration p and a medium for transporting the radiation supplied by the laser for injection into the wave-guiding structure, wherein the radiation source unit is further provided with a setting means for stabilizing a wavelength of the laser at a number n of selected wavelength bands from a number N of possibly selectable wavelength bands within one and the same pulse supplied by the laser, further in that the medium is dispersive with a wavelength-dependent travel time $t_D$. in which the selected wavelength bands, upon transport, are separable in time as a result of a dispersion.

14. The multiplex transmission system as claimed in claim 13, wherein the receiver comprises the at least one optical switch further wherein the light signal which can be applied to the entrance of the at least one optical switch is a composite light signal transported via the transmission medium and composed of a number of sub-signals via the-division multiplexing, from which composite light signal, a sub-signal can be selected by means of the radiation source unit.

15. The multiplex transmission system as claimed in claim 13, wherein the transmitter comprises the at least one optical switch wherein the transmitter further comprises a continuously operated laser whose wavelength is stabilized at a defined wavelength band for supplying the light signal which can be applied to the entrance gate of the at least one optical switch, and in that the pulses of the radiation source unit are carriers for a data series to be transported.

16. A transmitter for use in a multiplex transmission system having a transmitter and a receiver, the transmitter comprising:

at least one optical switch which is switchable via light, wherein the at least one optical switch comprises an optical wave-guiding structure whose refractive index is variable via light intensity and which has at least one entrance gate to which a light signal can be applied and at least one exit gate, and further comprises a radiation source unit whose radiation can be injected into the wave-guiding structure, the radiation source limit comprising at least one pulsed, first laser for supplying a pulse series having a repetition time T and a pulse duration p, said radiation source unit being provided with a setting means for stabilizing the wavelength of the at least one first laser to a number n of selected wavelength bands from a number N of possibly selectable wavelength bands within one and the same pulse supplied by the at least one first laser; and a continuous laser whose wavelength is stabilized at a defined wavelength band for supplying the light signal which can be applied to the entrance gate of said at least one optical switch, further wherein, the pulses of the radiation source unit are carriers of a data series to be transmitted, the at least one first laser being stabilized at a different wavelength $\lambda_i$ and wherein the setting means further comprises at least one second laser which corresponds to the at least one first laser and whose radiation can be injected into the associated first laser at an instant for which it holds that $E(P_m) > E(LP_i)$, in which $E(P_m)$ is the energy at a relevant instant of the second laser for a wavelength different from $\lambda_i$ of the corresponding first laser and $E(LP_i)$ is the radiation energy built up in the first laser at the relevant instant, said radiation source unit further comprises at least one wavelength discriminator corresponding to the at least one first laser and having a wavelength adjusted to the first laser for selecting said wavelength from the radiation emitted by the first laser after injection, said radiation source unit still further comprises means for combining and transporting the data series to be transmitted to the optical switch.

17. A transmitter as claimed in claim 16, wherein the at least one first laser comprises a plurality of first lasers, further wherein the first lasers are diode lasers having a Fabry-Pérot resonant cavity and being active at a wavelength $\lambda_i$ which is different for each first laser, and wherein the at least one second laser comprises a plurality of second lasers, further wherein the wavelength of the associated second lasers is adjusted to a mode which is different from $\lambda_i$ i of the associated first laser and fits in the resonant cavity of said first laser.

* * * * *